US009520833B1

(12) United States Patent
Wyse et al.

(10) Patent No.: US 9,520,833 B1
(45) Date of Patent: Dec. 13, 2016

(54) ACTIVE RING MIXER

(75) Inventors: Russell D. Wyse, Center Point, IA (US); Mark A. Willi, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 832 days.

(21) Appl. No.: 12/569,927

(22) Filed: Sep. 30, 2009

(51) Int. Cl.
*H04B 1/26* (2006.01)
*H03D 7/12* (2006.01)
*H03D 7/14* (2006.01)
*H04B 1/04* (2006.01)

(52) U.S. Cl.
CPC ........... *H03D 7/125* (2013.01); *H03D 7/1466* (2013.01); *H04B 1/0483* (2013.01)

(58) Field of Classification Search
CPC ...... H03D 7/1408; H03D 9/0616; H03D 9/06; H03D 9/0608; H04B 1/26
USPC ................................. 455/330, 326, 131, 317
See application file for complete search history.

(56) References Cited

U.S. PATENT DOCUMENTS

| 4,947,062 | A | | 8/1990 | Weiner et al. | |
|---|---|---|---|---|---|
| 5,155,455 | A | * | 10/1992 | Cowley et al. | 332/120 |
| 5,517,688 | A | * | 5/1996 | Fajen et al. | 455/333 |
| 5,603,113 | A | * | 2/1997 | De Loe, Jr. | 455/234.1 |
| 5,644,260 | A | * | 7/1997 | DaSilva et al. | 327/238 |
| 5,694,093 | A | * | 12/1997 | DaSilva et al. | 332/103 |
| 5,854,974 | A | * | 12/1998 | Li | 455/330 |
| 6,026,286 | A | * | 2/2000 | Long | 455/327 |
| 6,041,223 | A | * | 3/2000 | Thomas | 455/326 |
| 6,057,714 | A | | 5/2000 | Andrys et al. | |
| 6,078,802 | A | * | 6/2000 | Kobayashi | 455/326 |
| 6,122,497 | A | * | 9/2000 | Gilbert | 455/333 |
| 6,230,001 | B1 | | 5/2001 | Wyse | |
| 7,006,623 | B1 | * | 2/2006 | Patel | H04M 1/31 379/362 |
| 7,035,616 | B2 | | 4/2006 | Reynolds | |
| 7,164,897 | B2 | | 1/2007 | Manku et al. | |
| 7,236,763 | B2 | | 6/2007 | Heck | |
| 7,952,408 | B2 | * | 5/2011 | Eisenstadt et al. | 327/231 |
| 2004/0046596 | A1 | * | 3/2004 | Kaeriyama et al. | 327/165 |

(Continued)

OTHER PUBLICATIONS

Barrie Gilbert, "The Micromixer: A Highly Linear Variant of the Gilbert Mixer Using a Bisymmetric Class-AB Input Stage", Article from IEEE Journal of Solid-State Circuits, vol. 32, No. 9, Sep. 1997.

(Continued)

*Primary Examiner* — Md Talukder
*Assistant Examiner* — Richard Chan
(74) *Attorney, Agent, or Firm* — Daniel M. Barbieri; Donna P. Suchy; Angel N. Gerdzhikov

(57) ABSTRACT

An active ring mixer circuit for use in a receive or transmit channel of an RF radio. The circuit comprises plural transistor pairs arranged in a ring and biased into an active or saturation region. A first input is adapted to receive an RF signal. The first input is electrically combined with the plural transistor pairs to provide negative feedback to the plural transistor pairs. A second input electrically combined with the plural transistor pairs is adapted to receive a local oscillator signal. An output of the mixer is adapted to provide a mixed signal from the plural transistor pairs. Advantageously, the mixer circuit induces little low frequency spurs that may interfere with radio operation and has significantly reduced power consumption, lower noise figure, and good balance.

14 Claims, 3 Drawing Sheets

(56) References Cited

U.S. PATENT DOCUMENTS

2006/0088122 A1     4/2006   Choi et al.
2010/0039174 A1*   2/2010   Teetzel ........................ 330/149
2010/0327940 A1*   12/2010   Eisenstadt et al. .......... 327/357

OTHER PUBLICATIONS

Peregrine Semiconductor Corporation, "Ultra-High Linearity UltraCMOS Broadband Quad MOSFET Array" Product Specification piece, Document No. 70-0089-09.
Wikipedia, "Ring Modulation", Sep. 23, 2009.

* cited by examiner

US 9,520,833 B1

ACTIVE RING MIXER

BACKGROUND

This invention relates to radio communications and more specifically to radio frequency (RF) mixer circuit and method used in RF equipment.

RF communication equipment generally uses mixers to convert a signal from a low frequency to a high frequency or a high frequency to a low frequency by mixing the signal with a local oscillator (LO) signal. The LO frequency can be above or below the frequency of a desired signal to produce a sum and a difference frequency, one of which is the frequency of interest.

Mixer performance is critical to the overall performance of the transmit and receive channels of RF equipment that employ mixers. It is especially critical in receiver applications where the dynamic range of the receiver is limited by the mixer. Mixers should have good linearity or intermodulation performance characteristics, wide dynamic range, low power consumption, low noise interference, and offer conversion gain in some applications.

What is needed for direct conversion and other receiver applications is a mixer having little or no anomalous low frequency spurs, low distortion, significantly reduced power consumption, lower noise figure, good balance, and low cost.

SUMMARY

According to the present invention, there is provided an active ring mixer circuit suitable for use in an RF receiver. The circuit comprises first and second transistor pairs arranged in a ring and biased into an active region of operation; a first input of the ring adapted to receive an RF signal through respective resistors of the first and second transistor pairs; a second input of the ring coupled to respective gates of the first and second transistor pairs and adapted to receive a local oscillator signal; and an intermediate frequency output of the ring adapted to provide a mixed signal from the plural transistor pairs whereby, during operation, the resistors of the first input produce negative feedback to enhance linearity of the RF mixer.

In an embodiment, the active ring mixer is contained on an integrated circuit using transistors, such as BJT, FET, MOS, CMOS, Bi-CMOS, HBY, MES-FET, or HEMT type transistors, which are biased into the active region. For FET type transistors, the active region is the saturation region. The impedance at the RF input is substantially determined by a resistance between the differential input and the transistors. The impedance of the local oscillator input is substantially determined by a resistance across the differential LO input.

The mixer is operable with the local oscillator signal having a power level significantly lower than needed for a passive ring mixer configuration and in an embodiment the mixer is operable with a local oscillator signal having a power less than +6 dBm. Transistor bias current flows through resistors combined with the source of the transistors which stabilizes the DC bias of the active ring mixer and provides RF feedback current through the source of the transistor which increases the active ring mixers linearity and low distortion capability, thus reducing spurious signals from a pre-selected band of the mixed signal.

In another embodiment, a method of mixing an RF signal is disclosed. A first signal is received at a first port of an active ring mixing circuit. A second signal is received at a second port of the active ring mixing circuit. The transistors are arranged in a ring as plural transistor pairs and are biased into an active region. The first and second signals are combined to produce a mixed signal. The mixed signal is outputted at an output port of the mixing circuit.

In yet another embodiment, there is provided an RF radio that includes an active ring mixer. The active ring mixer in the RF radio includes plural transistor pairs arranged in a ring and a biasing circuit to bias the transistors into an active region. A first input of the ring mixer is adapted to receive an RF input signal and a second input of the ring mixer is adapted to receive a local oscillator signal. A junction combines the RF and local oscillator signals to produce a mixed signal. The mixed signal is supplied to the transmit or receive channel.

These and other aspects, features, and advantages of the invention will become apparent upon review of the following description taken in connection with the accompanying drawings. The invention, though, is pointed out with particularity by the appended claims.

DESCRIPTION OF ILLUSTRATIVE EMBODIMENTS

Radio frequency (RF) mixers are often used for up-converting an intermediate frequency (IF) signal to a high frequency or down-converting a high frequency signal to an IF and may be used in both frequency conversion and frequency synthesis applications. There are many types of mixers, such as unbalanced, single and double balanced. Mixers can be passive diode or active transistor types and constructed with discrete components or using various fabrication technologies, including on a semiconductor substrate such as silicon (SI) substrate, silicon-germanium (Si—Ge) substrate, gallium-arsenide (GaAs) substrate, or gallium-nitride (GaN) on silicon substrate, and various transistor types, including bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MES-FET) and high electron mobility transistor (HEMT) design technologies.

The present invention is illustrated in the context of an RF transceiver implemented as an FET-based integrated circuit (IC). The transceiver RFIC may be used to perform amplification, RF to intermediate frequency (IF) frequency conversion, and gain control functions in a wireless handset or base-station application.

Figure 1:
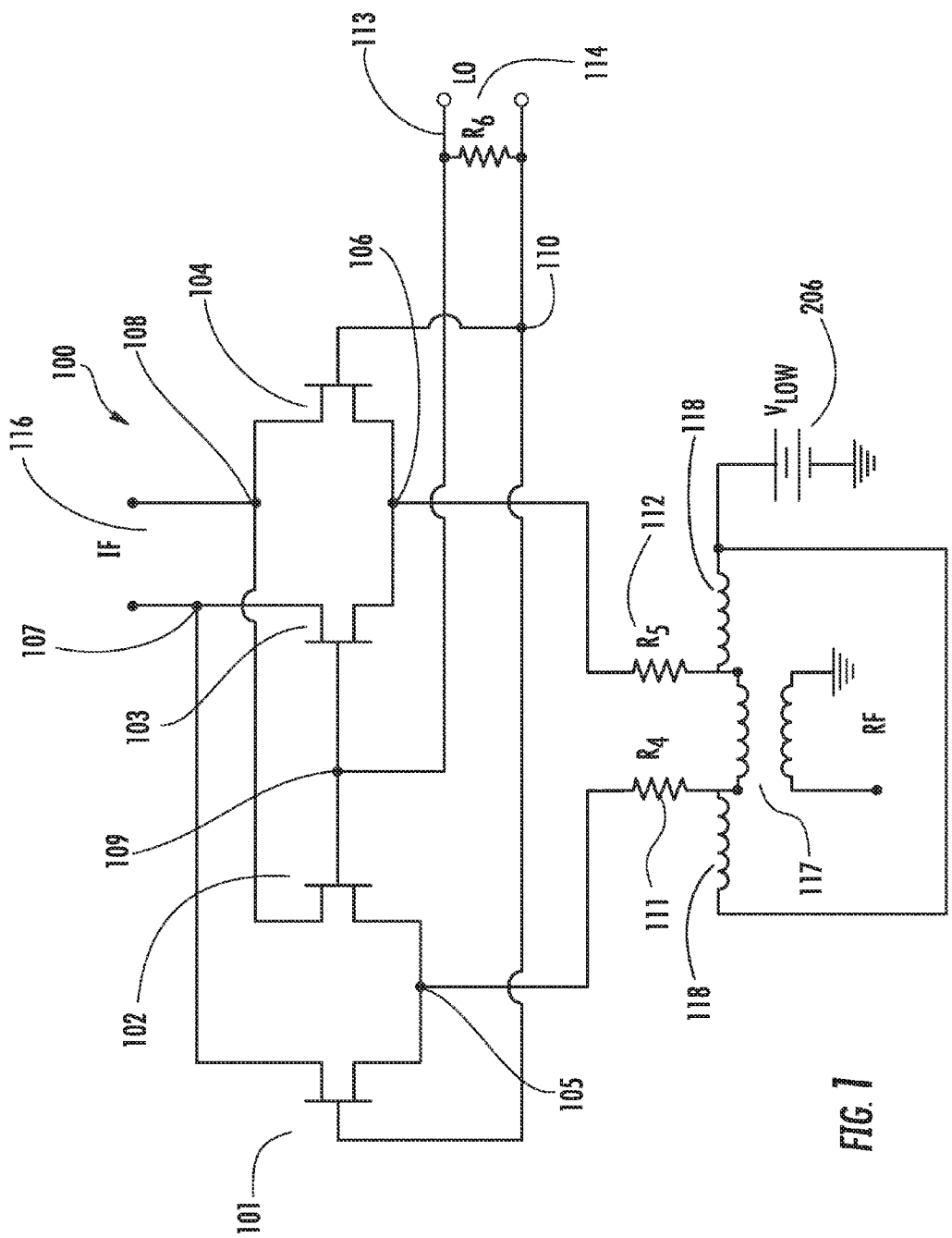
FIG. 1 is a schematic diagram of an active ring mixer in accordance with the present invention.

FIG. 1 shows a schematic of an active ring mixer 100. The active ring mixer 100 has dual pairs of FETs 101-102 and 103-104, with FET having a source, drain, and a gate. The dual FET pairs 101-102 and 103-104 are electrically connected at terminals 105 and 106, respectively. The drains of FETs 101 and 103 are connected at terminal 107 and the drains of FETs 102 and 104 are connected at terminal 108. The gates of FETs 101 and 104 are interconnected at terminal 110 and the gates of FETs 102 and 103 are interconnected at terminal 109.

In one embodiment of the invention, an active ring mixer 100 in a receive mode has a differential RF signal applied to the sources of the dual FET pairs 101-102 and 103-104 through resistors 111 and 112. Also, a differential local oscillator (LO) signal is applied to the gates of the FETs 101-104, such that one FET in each pair has a higher transconductance than the other FET for each half-cycle. Finally, a differential intermediate frequency (IF) or output signal is provided by the drains of the FETs 101-104. The impedance of the LO input port 114 is determined primarily by the selection of a resistor 113 due to the very high impedance at the gate. Correspondingly, the impedance of the RF input port is determined by resistors 111 and 112 due to the very low impedance at the source.

In operation, the transistors 101-104 of the active ring mixer 100 are biased into the active region, for FETs this is the saturation region, by a steady state DC voltage applied across terminals 113 and 114. An exemplary transistor biasing circuit may be provided by voltage supply 205 of FIG. 2, which provides a biasing voltage directly to the gate of each transistor. In an embodiment, voltage supply 204 is the highest voltage, voltage supply 206 is at lower reference voltage than voltage supply 204, and voltage supply 205 is selectively set in accordance with the transistor technology to ensure active region bias. The LO signal then modifies the transconductance of the FETs 101-102 and 103-104 around the quiescent operating point, such that the FETs 101-102 and 103-104 remain in the active region of operation. The difference between voltage supply 204 and voltage supply 206 is set at a sufficiently high value to keep the RF signals across the drain/source connections of the FETs 101-102 and 103-104 from pushing the FETs 101-102 and 103-104 out of the active region. By keeping operation of the FETs 101-102 and 103-104 in the active region, the invention advantageously achieves, among other things, superior linearity performance with as little as 6 dBm of LO drive level compared to 17-20 dBm for most double balanced FET and diode ring mixers.

The active ring mixer 100 is stabilized by DC and RF negative feedback to reduce the variability in the DC current through the drain to source of the FETs 101-104 as well as further linearizing the RF performance. The RF signal is applied to the sources of the FETs 101-104 through the negative feedback resistors 111 and 112 and transformer 117. Two choke inductors 118 on the active ring mixer 100 side of the transformer 117 are coupled between the respective resistors 111 and 112 and a low voltage source 206. The other side of the transformer 117 is tied to ground which provides a zero reference point at the RF input ports. DC voltage is applied to the gates of the FETs 101-104, as DC current flows through the drain to source connection of the FETs 101-104, the voltage drop across resistors 111 and 112 increases, which then reduces the gate to source voltage of the FETs 101-104, which reduces the DC current, thus providing negative feedback.

Figure 2:
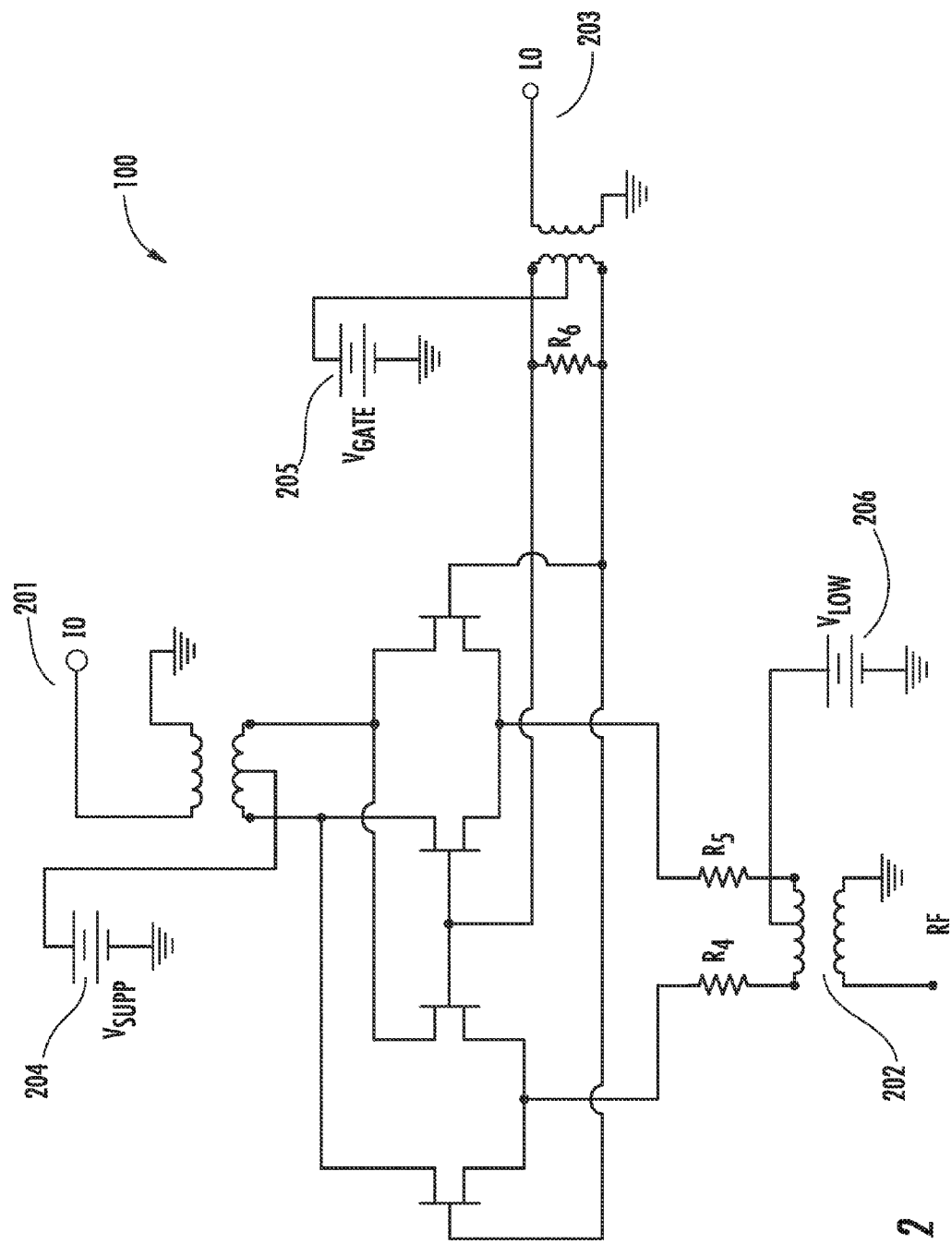
FIG. 2 is a schematic diagram of an active ring mixer with baluns in accordance with another aspect of the invention.

Referring to FIG. 2, an alternate embodiment of the active ring mixer 100, the active ring mixer 100 is electrically combined with one or more baluns 201-203 (short for BALanced to Unbalanced transformers). The baluns are transformers connected between a balanced signal line and an unbalanced signal line. A balanced line has two signals line conductors, with equal currents in opposite directions. The unbalanced signal line has just one conductor; the current in it returns via a common ground path. In this alternative embodiment, the active ring mixer is biased by one or more voltage supplies 204-206 tied to respective center-taps of the transformers 201-203.

In yet another alternative variant of the present invention, the active ring mixer 100 may be incorporated into a portable communications device such as an RF transmitter-receiver of a mobile phone, a personal communications service (PCS) phone, a wireless local area network (LAN) transmitter-receiver, etc.

Figure 3:
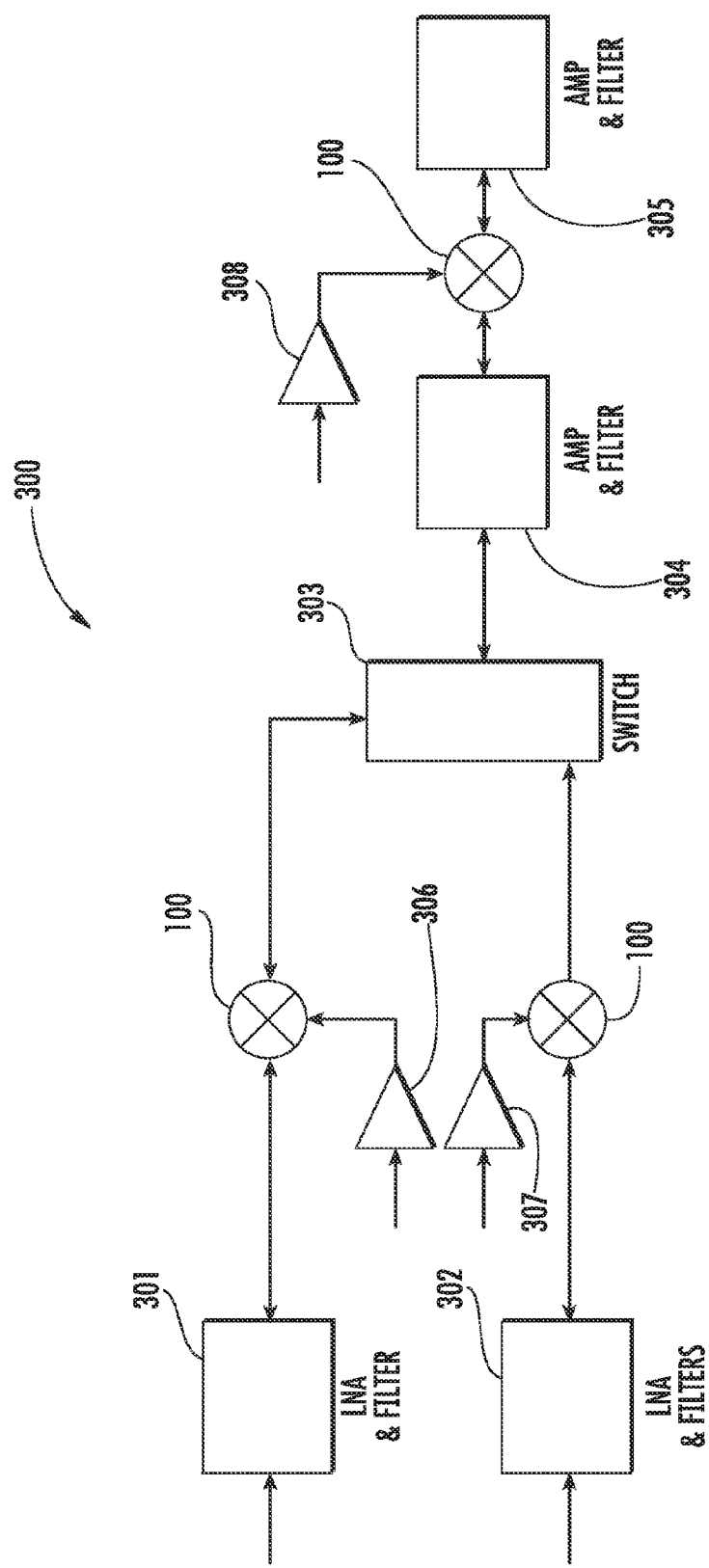
FIG. 3 is a schematic of a portion of a signal processing system in which the circuits of FIG. 1 or 2 may be incorporated.

FIG. 3 discloses an embodiment of a signal processing circuit 300 found in such devices, but incorporating the active ring mixer 100. A signal is received in a filter and low noise amplifier circuit 301. The amplified signal is combined with an LO signal from a LO circuit 306 in an active ring mixer 100. One or more variations of the mixed signal from the active ring mixer 100 is selected by a switch 303, after which it is filtered and amplified by a filter and amplifier circuitry 304. The amplified signal is then combined with another LO signal from a LO circuit 308 then amplified by the amplifier and changed into a digital signal (device not shown) where it is subsequently processed. One skilled in the art would recognize that the above is only a small part of a device and that there's a multitude of signal processing functions that may be performed depending upon the specific use of the signal processing circuit 300.

In prior signal processing circuitry, the mixer may be the limiting component for attaining the desired performance. For one reason, signals are mixed after having been processed by multiple signal processing components. The resulting gain of the signal prior to mixing is sufficiently high that is causes problems for the overall system. For example, when multiple signals are received at the mixer port the signals mix and produce spurious products in the pass band. The improved active ring mixer 100, however, allows the designer more tolerance in his design so that the spurious products can be reduced from the output signal. Further, the designer can now lessen the stringent requirements on the other components of the signal processing system 300, which allows the designer to select less expensive components because system is not being operated at its limits.

While the present invention has been particularly shown and described with reference to exemplary embodiments thereof, it should be understood by those of ordinary skill in the art that various changes, substitutions and alterations can be made herein without departing from the scope of the invention as defined by appended claims and their equivalents.

We claim:

1. A method of mixing an RF signal comprising:
   receiving a first signal at a first port of an active ring mixing circuit;
   receiving a second signal at a second port of the active ring mixing circuit;
   biasing transistors arranged in a ring as plural transistor pairs into an active region where the transistors operate with amplification with a DC voltage applied to the second signal, wherein the transistors are FET and the active region is a saturation region;
   modifying a transconductance of the plural transistor pairs near a quiescent operating point to substantially maintain the plural transistor pairs in the active region;
   combining the first and second signals to produce a mixed signal;
   outputting the mixed signal at an output port of the active ring mixing circuit; and providing negative feedback through a source of the FET, wherein the first port is electrically connected to the source of the FET adapted to received a radio frequency signal.

2. The method of claim 1, wherein the first signal is a RF signal and is one of a balanced RF signal or unbalanced RF signal.

3. The method of claim 1, wherein the second signal is a local oscillator signal and is one of a balanced local oscillator signal or unbalanced local oscillator signal.

4. The method of claim 3, wherein the local oscillator signal the active ring mixing circuit is receiving has a power less than +6 dBm.

5. The method of claim 1, further comprising providing DC stabilization as feedback current increases.

6. The method of claim 1, further comprising preselecting a band from the mixed signal and reducing spurious signals from the pre-selected band of the mixed signal.

7. An RF mixer comprising:
first and second transistor pairs arranged in a ring and biased into an active region of operation where the first and second transistor pairs operate with amplification with a DC voltage applied to a local oscillator signal;
a first input of the ring adapted to receive an RF signal through respective resistors of said first and second transistor pairs;
a second input of the ring coupled to respective gates of said first and second transistor pairs and adapted to receive a local oscillator signal, which modifies a transconductance of the first and the second transistor pairs near a quiescent operating point to substantially maintain the first and the second transistor pairs in the active region; and
an intermediate frequency output of the ring adapted to provide a mixed signal from the transistor pairs whereby, during operation, said resistors of said first input produce negative feedback to enhance linearity of the RF mixer, wherein the transistors are FET having a source, gate, and drain, wherein the RF signal is applied to the source, the local oscillator signal is applied the gate, and the active region is a saturation region, and wherein the RF signal is applied to a source of the FET such that a negative feedback current through the source stabilizes the RF mixer.

8. The RF mixer of claim 7, wherein the local oscillator signal has a power less than +6 dBm.

9. The RF mixer of claim 7, wherein the RF mixer reduces spurious signals from a pre-selected band of the mixed signal.

10. The RF mixer of claim 7, wherein the mixer is driven by the local oscillator signal having a power level less than +6 dBm, wherein an impedance of an RF input to the RF mixer is substantially determined by a resistance between the first input being a differential first input and the transistors, wherein the impedance of a local oscillator input to the RF mixer is substantially determined by a resistance across the second input being a differential second input.

11. An RF radio comprising:
at least one of a transmit and receive channel to process an RF signal; an active ring mixer in the at least one of the transmit and receive channels that includes plural transistor pairs arranged in a ring;
a biasing circuit to bias the transistors into an active region where the transistors operate with amplification with a DC voltage applied to a local oscillator signal, wherein the transistors in the active ring mixer are FET and the active region is a saturation region;
a first input of the ring mixer to receive an RF input signal;
a second input of the ring mixer to receive the local oscillator signal which modifies a transconductance of the plural transistor pairs near a quiescent operating point to substantially maintain the plural transistor pairs in the active region;
a junction that combines the RF and local oscillator signals to produce an mixed signal; and
an output to supply the mixed signal to the at least one of the transmit and receive channels, wherein the RF signal is applied to a source of the FET such that a negative feedback current through the source stabilizes the active ring mixer.

12. The RF radio of claim 11, wherein the local oscillator signal has a power less than +6 dBm.

13. The RF radio of claim 11, wherein the active ring mixer reduces spurious signals from a pre-selected band of the mixed signal.

14. The RF radio of claim 11, wherein the first input is connected to the transistor ring pairs such that the RF signal provides negative feedback to the active ring mixer, wherein the transistors are connected to the second input such that the transistors are biased in to the active region by the local oscillator, the local oscillator having a power level less than +6 dBm, wherein an impedance of the RF input to the active ring mixer is substantially determined by a resistance between the first input and the transistors, wherein the impedance of a local oscillator input to the active ring mixer is substantially determined by a resistance across the second input being a differential second input.

* * * * *